United States Patent
Donolo et al.

(10) Patent No.: US 11,381,084 B1
(45) Date of Patent: Jul. 5, 2022

(54) FREQUENCY MEASUREMENT FOR LOAD SHEDDING AND ACCURATE MAGNITUDE CALCULATION

(71) Applicant: Schweitzer Engineering Laboratories, Inc., Pullman, WA (US)

(72) Inventors: Marcos A. Donolo, Pullman, WA (US); Jay Hartshorn, Moscow, ID (US); Veselin Skendzic, Schwenksville, PA (US); Chandrasekaran Swaminathan, Orefield, PA (US); Vinod K. Yedidi, King of Prussia, PA (US); Angelo D'Aversa, Ambler, PA (US); Hang Li, King of Prussia, PA (US); Subhash C. Patel, West Chester, PA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/494,190

(22) Filed: Oct. 5, 2021

(51) Int. Cl.
| | | |
|---|---|---|
| *H02J 3/14* | (2006.01) | |
| *G05F 1/70* | (2006.01) | |
| *H02J 3/16* | (2006.01) | |
| *H02J 3/38* | (2006.01) | |
| *G01R 23/02* | (2006.01) | |

(52) U.S. Cl.
CPC .............. *H02J 3/144* (2020.01); *G01R 23/02* (2013.01); *G05F 1/70* (2013.01); *H02J 3/16* (2013.01); *H02J 3/388* (2020.01)

(58) Field of Classification Search
CPC ... H02J 3/144; H02J 3/16; H02J 3/388; G01R 23/02; G05F 1/70
See application file for complete search history.

(56) References Cited

U.S. PATENT DOCUMENTS

| | | |
|---|---|---|
| 4,636,909 A | 1/1987 | Brandt |
| 4,672,501 A | 6/1987 | Bilac |
| 4,715,000 A | 12/1987 | Premerlani |
| 4,829,298 A | 5/1989 | Fernandes |
| 5,006,846 A | 4/1991 | Granville |
| 5,224,011 A | 6/1993 | Yalla |
| 5,321,350 A | 6/1994 | Haas |
| 5,398,029 A | 3/1995 | Toyama |
| 5,446,682 A | 8/1995 | Janke |
| 5,498,956 A | 3/1996 | Kinney |
| 5,592,393 A | 1/1997 | Yalla |

(Continued)

OTHER PUBLICATIONS

Bogdan Kasztenny "A New Method for Fast Frequency Measurement for Protection Applications" Presented at the 13th International Conference on Developments in Power System Protection. Edinburgh, United Kingdom. Mar. 2016.

(Continued)

*Primary Examiner* — Akm Zakaria
(74) *Attorney, Agent, or Firm* — Bradley W. Schield; Fletcher Yoder, P.C.

(57) ABSTRACT

A method includes receiving electrical measurements of an input signal of a power system. The method includes determining an estimated frequency of the power system using a rate of change of phase of the power system and using zero crossings of the power system. Selection between using the rate of change of phase of the power system and using zero crossings of the power system is based on a comparison between an estimated phase angle and a measured phase angle of the power system.

20 Claims, 7 Drawing Sheets

(56) References Cited

U.S. PATENT DOCUMENTS

| | | | |
|---|---|---|---|
| 5,689,511 | A | 11/1997 | Shimazaki |
| 5,710,710 | A | 1/1998 | Owen |
| 5,721,689 | A | 2/1998 | Hart |
| 5,724,041 | A | 3/1998 | Inoue |
| 5,805,395 | A | 9/1998 | Hu |
| 5,809,045 | A | 9/1998 | Adamiak |
| 5,995,911 | A | 11/1999 | Hart |
| 6,141,196 | A | 10/2000 | Premerlani |
| 6,148,267 | A | 11/2000 | Premerlani |
| 6,236,949 | B1 | 5/2001 | Hart |
| 6,311,307 | B1 | 10/2001 | Adamiak |
| 6,313,614 | B1 | 11/2001 | Persson |
| 6,366,864 | B1 | 4/2002 | Kulidjian |
| 6,426,856 | B1 | 7/2002 | Schneerson |
| 6,446,682 | B1 | 9/2002 | Viken |
| 6,456,947 | B1 | 9/2002 | Adamiak |
| 6,571,182 | B2 | 5/2003 | Adamiak |
| 6,603,298 | B2 | 8/2003 | Guzman-Casillas |
| 6,662,124 | B2 | 12/2003 | Schweitzer, III et al. |
| 6,717,394 | B2 | 4/2004 | Elms |
| 6,845,333 | B2 | 1/2005 | Anderson |
| 6,934,654 | B2 | 8/2005 | Benmouyal |
| 7,328,114 | B2 | 2/2008 | Premerlani |
| 8,054,051 | B2 | 11/2011 | Nagata |
| 8,065,140 | B2 | 11/2011 | Sakurai |
| 8,140,283 | B2 | 3/2012 | Benmouyal |
| 8,706,309 | B2 | 4/2014 | Schweitzer |
| 8,749,422 | B1 | 6/2014 | Moore |
| 9,746,545 | B1 * | 8/2017 | Prestwich ............ G01S 13/4409 |
| 10,312,041 | B2 | 6/2019 | Kasztenny |
| 2001/0012984 | A1 | 8/2001 | Adamiak |
| 2003/0011352 | A1 | 1/2003 | Guzman-Casillas |
| 2004/0186669 | A1 | 9/2004 | Benmouyal |
| 2006/0069522 | A1 | 3/2006 | Bruno |
| 2006/0247874 | A1 | 11/2006 | Premerlani |
| 2007/0008033 | A1 | 1/2007 | Okazaki |
| 2007/0086134 | A1 | 4/2007 | Zweigle |
| 2007/0136013 | A1 | 6/2007 | Premerlani |
| 2009/0254291 | A1 | 10/2009 | Benmouyal |
| 2010/0161263 | A1 | 6/2010 | Benmouyal |
| 2010/0225524 | A1 | 9/2010 | Szajnowski |
| 2011/0071695 | A1 * | 3/2011 | Kouroussis ............... H02J 3/01 700/295 |
| 2011/0077885 | A1 * | 3/2011 | Zweigle .............. G01R 19/2513 702/66 |
| 2013/0121046 | A1 * | 5/2013 | Xue .......................... H02J 3/44 363/74 |
| 2013/0341922 | A1 * | 12/2013 | Jimenez Buendia ..... F03D 9/25 290/44 |
| 2014/0327574 | A1 | 11/2014 | Achanta |
| 2016/0091537 | A1 * | 3/2016 | Gaarder .................. H04Q 9/00 324/764.01 |
| 2017/0040900 | A1 | 2/2017 | Vaughan |
| 2017/0146577 | A1 | 5/2017 | Kasztenny |
| 2018/0364290 | A1 | 12/2018 | Xia |
| 2020/0096546 | A1 | 3/2020 | Donolo |

OTHER PUBLICATIONS

Hart, D., "A New Frequency Tracking and Phasor Estimation Algorithm for Generator Protection", IEEE Transaction on Power Delivery, vol. 12, No. #, pp. 1064-1073, Jul. 1997.

Sezi, T., "A New Method for Measuring Power System Frequency", IEEE Transmission and Distribution, vol. 1, pp. 400-405, IEEE, 1999.

Maohai Wang, Yuanzhang Sun, "A Practical, Precise Method for Frequency Tracking and Phasor Estimation", IEEE Transactions on Power Delivery, vol. 19., No. 4, Oct. 2004.

Gabriel Benmouyal, An Adaptive Sampling-Interval Generator for Digital Relaying, IEEE Transactions on Power Delivery, vol. 4, No. 3, Jul. 1989.

Gabriel Benmouyal, "Removal of DC-Offset in Current Waveforms Using Digital Mimic Filtering", IEEE Transactions on Power Delivery, vol. 10, No. 2, Apr. 1995.

Bijoy Chattopadhyay, et al., "A New Frequency Measurement Algorithm in the Presence of Harmonics Using Instantaneous Phasors Quantities", CCECE, 1996.

Daqing Hou, "Relay Element Performance During Power System Frequency Excursions", Aug. 2007.

Moore, P.J., et al., "Frequency Relaying Based on Instantaneous Frequency Measurement", IEEE, 1996.

Phadke, A.G., et al., "A New Measurement Technique for Tracking Voltage Phasors, Local System Frequency, and Rate of Change of Frequency", IEEE Transactions on Power Apparatus and Systems, 1983.

M.S. Sachdev, M.A. Baribeau, "A New Algorithm for Digital Impedance Relays", IEEE Transactions on Power Apparatus and Systems, vol. PAS-98, No. 6, Nov. 1979.

E.O. Schweitzer, III, Daqing Hou, "Filtering for Protective Relays", 47th Georgia Tech Protective Relaying Conference, Apr. 28-30, 1993.

Sezi, T., "A New Method for Measuring Power System Frequency", NWPPA Engineering and Operations Conference, Spokane, WA, Apr. 17-21, 2000.

T.S. Sidhu, M.S. Sachdev, An Iterative DSP Technique for Tracking Power System Frequency and Voltage Phasors, IEEE, 1996.

Stenbakken, Gerard, et al., "Reference Values for Dynamic Calibration of PMUs", Proceedings of the 41st Hawaii International Conference on System Sciences, Jan. 7, 2008.

Liancheng Wang, "Frequency Response of Phasor-Based Microprocessor Relaying Algorithms", IEEE Transactions on Power Delivery, vol. 14, No. 1, Jan. 1999.

Jun-Zhe Yang, Chih-Wen Liu, "A Precise Calculation of Power System Frequency and Phasor", IEEE Transactions on Power Delivery, vol. 15, No. 2, Apr. 2000.

Roger R. Labbe Jr., "Kalman and Bayesian Filters in Python" Sep. 2014, pp. 75-117.

Paul R. Kalata, "The Tracking Index: A Generalized Prameter for $\alpha$-$\beta$ and $\alpha$-$\beta\gamma$ Target Trackers", IEEE Transactions on Aerospace and Electronic Systems, vol. AES-20, No. 2, Mar. 1984. Downloaded on Oct. 11, 2021 from https://ieeexplore.ieee.org/document/4103918., pp. 174-182.

* cited by examiner

FREQUENCY MEASUREMENT FOR LOAD SHEDDING AND ACCURATE MAGNITUDE CALCULATION

TECHNICAL FIELD

The present disclosure generally relates to estimating frequency of a power system, and, more particularly, to estimating frequency using a combination of frequency from zero crossings and frequency from rate of change of phase.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Electrical power generation and delivery systems are designed to generate, transmit, and distribute electrical energy to loads. Electrical power generation and delivery systems may include equipment, such as electrical generators, electrical motors, power transformers, power transmission and distribution lines, circuit breakers (CBs), disconnects, buses, transmission lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment.

IEDs may obtain electrical measurements to monitor electrical conditions and perform actions to protect the power system. For example, frequency may decrease when the amount of power generated is less than the amount of power demanded by loads. IEDs may use frequency protection in which the IED sheds load to reduce the amount of power demanded, thereby balancing generation with demand. One technique to determine the operating frequency of the power system is by looking at the zero crossings of the voltage and/or current of the power system. However, zero crossings alone may not track the frequency accurately when the frequency is changing. As explained below, a combined frequency tracking algorithm may be used that combines frequency from zero crossings with frequency from phase rate of change.

Figure 1:
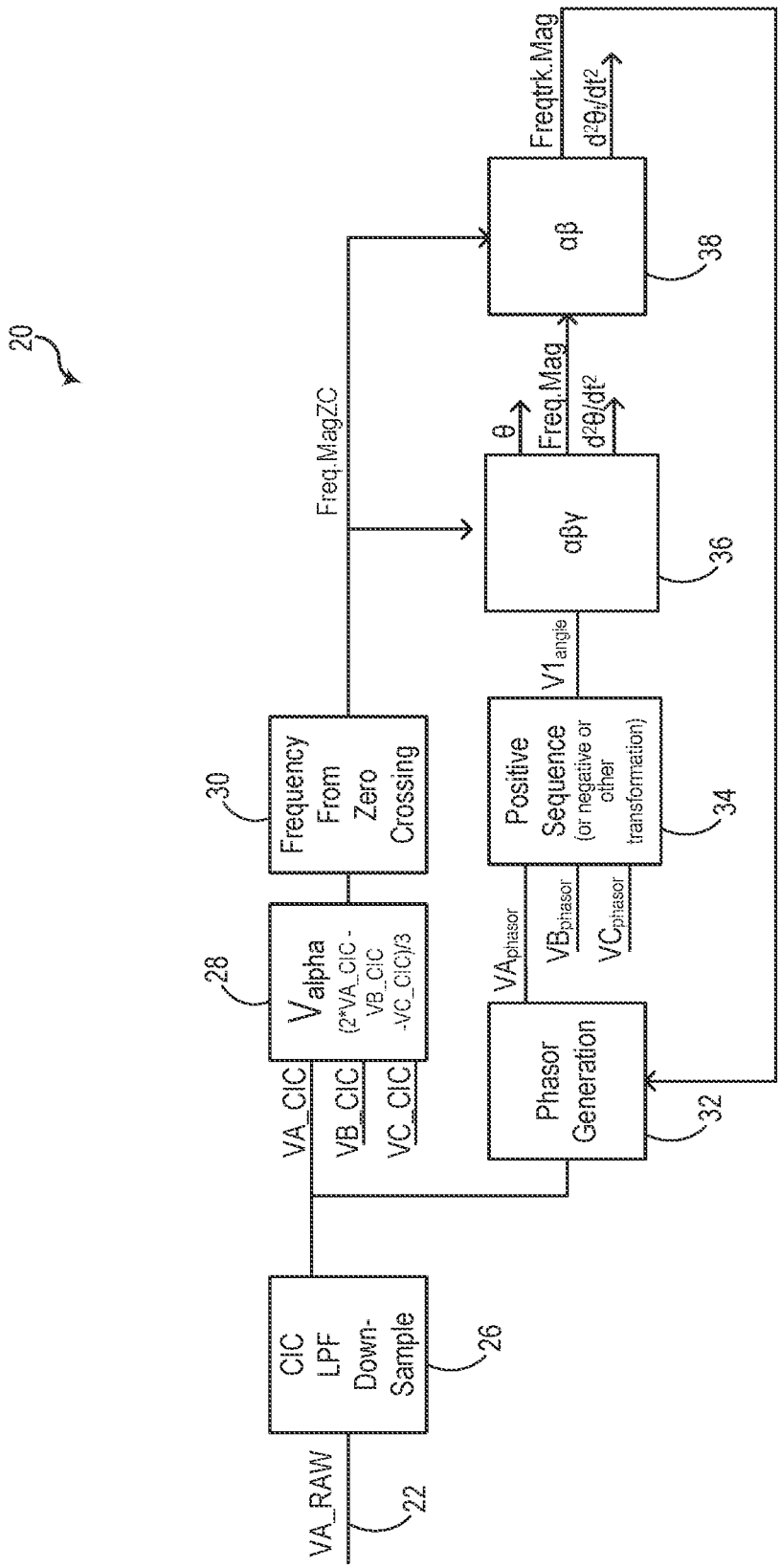
FIG. 1 illustrates a block diagram of a process performed by an intelligent electronic device (IED) of a power system to estimate the frequency of the power system, in accordance with an embodiment.

FIG. 1 is a block diagram of a frequency measurement process 20 in which an IED may estimate an operating frequency of a power system by using a combination of frequency from zero crossings and frequency from a rate of change of phase from electrical measurements of the power system, in accordance with an embodiment. As illustrated, the IED may receive an electrical measurements 22 of an input signal to monitor an electrical characteristic, such as voltages and/or currents, of the power system. While raw (i.e., unprocessed) electrical measurements of an A-phase in a three-phase power system are shown as the input signal to the IED in the illustrated embodiment, similar processes may be performed on any suitable number of phases of a power system or other input signals.

The IED may apply pre-processing operations (block 26) to the electrical measurements 22 to prepare the electrical measurements 22 for frequency tracking by reducing noise andlor improving reliability of the input signal. For example, the electrical measurements 22 may be filtered via a cascaded integrator-comb (CIC) filter and/or a low pass filter (LPF) to smooth the input signal. The input signal may down-sampled to reduce the sampling rate of electrical measurements. While these pre-processing operations are given as examples, other filtering or pre-processing operations may be performed on the input signal.

The IED may determine the frequency of the power system using a combination of different frequency techniques to improve accuracy of the estimated operating frequency. For example, the IED may determine the frequency from zero crossings of the electrical measurements when a difference between an estimated operating frequency and a measured operating frequency exceeds a threshold and determine the frequency from the rate of change of phase of the electrical measurements when the difference is below the threshold.

Figure 2:
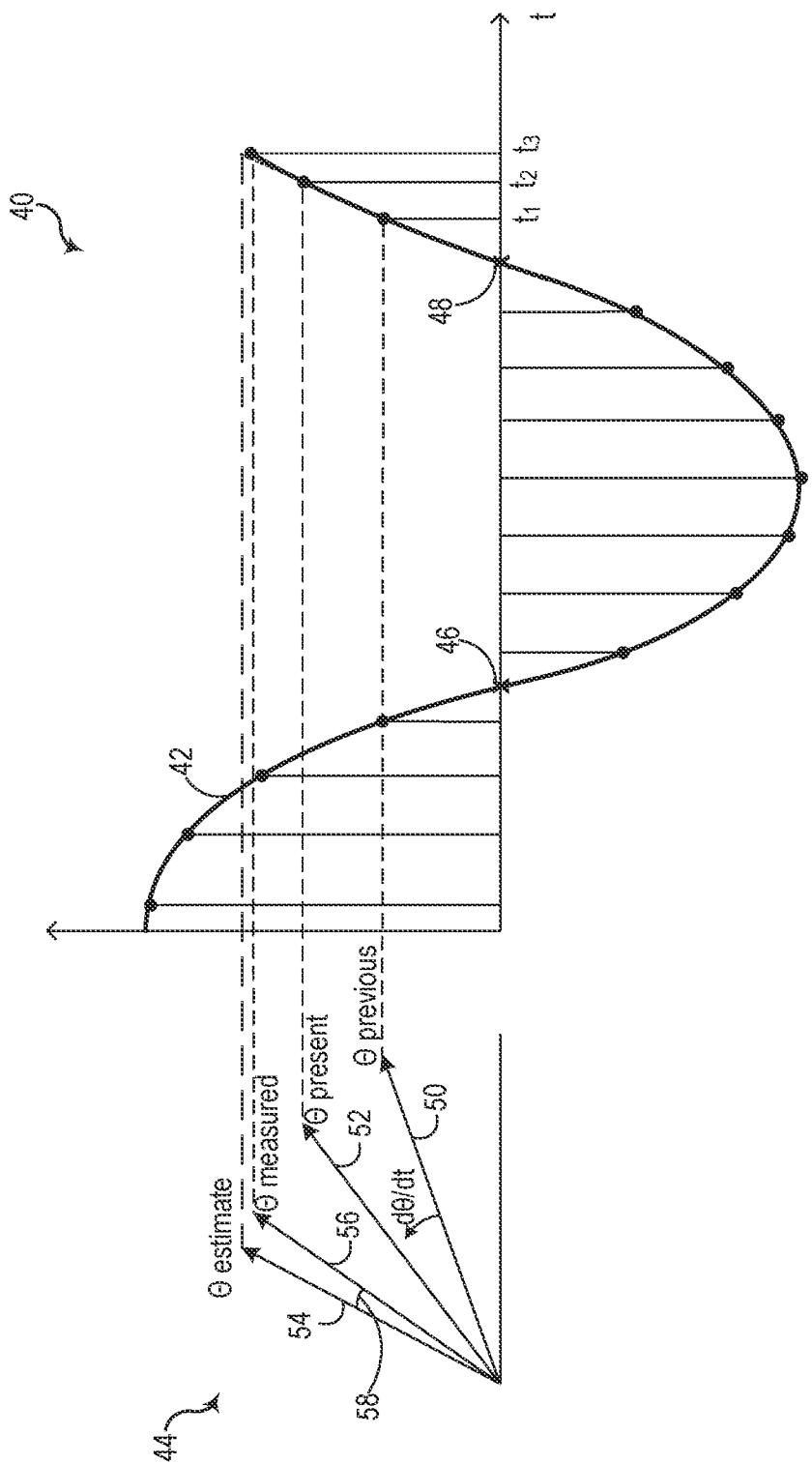
FIG. 2 is a plot of an input signal in which the IED performs the process of FIG. 1 to estimate the operating frequency of the power system, in accordance with an embodiment.

FIG. 2 illustrates a plot 40 of electrical measurements of an input signal 42 obtained from a power system. Further, FIG. 2 illustrates a phasor diagram 44 of the input signal 42 with respect to the corresponding electrical measurements at times $t_1$-$t_3$ from the input signal in the plot 40. The input signal 42 may be a voltage or current sinusoidal waveform of a phase of the power system that periodically has zero crossings 46 and 48 in which the signal changes from positive to negative or negative to positive. Note that while applying certain signal processing techniques (e.g., transformations, filters, etc.) are described as being applied to the input signal below, note that any suitable processing may be applied to the input signal for the zero crossing technique and the same or different processing may be applied to the rate of change of phase technique.

In the illustrated embodiment, the IED may obtain times in which the zero crossings 46 and 48 of the power system occurred. The time at which zero crossings occurred is determined by a sign change between consecutive samples and then interpolating between the samples. The frequency may be computed as one over the time period between consecutive positive to negative zero crossing times and between consecutive negative to positive zero crossings.

The IED may obtain the phasor measurements 50 and 52 of the input signal, which may include a magnitude and phase. The IED may store previous phasor measurements ($\theta_{previous}$). The IED may determine a rate of change of phase (i.e., first derivative ($d\theta/dt$)) from the previous phasor measurement and the present measurement ($\theta_{present}$) and the amount of time therebetween. The IED may determine an estimated phase 54 ($\theta_{estimate}$) of time $t_3$, prior to time $t_3$, based on the present measurement, the first derivative, and the second derivative. For example, the estimated phase 54 at time t may be calculated as:

$$\theta_{estimate} = \theta_{present} + \theta' t + \frac{1}{2}\theta'' t^2 \quad (1)$$

where $\theta'$ is the first derivative, $\theta''$ is the second derivative, and $\theta_{present}$ is the most recent measurement. The second derivative may be determined from the previous first derivative calculations. The rate of change of phase (i.e., first derivative) may be used as the measured frequency of the input signal.

When time $t_3$ occurs, the IED may obtain a measured phase ($\theta_{measured}$) 56. The difference 58 between the estimated phase 54 and the measured phase 56 may be used to determine whether the phase, the first derivative of the phase, and the second derivative of the phase are accurate.

Returning to FIG. 1, the IED may determine $V_{alpha}$ (block 28) using the filtered input signals ((2*VA_CIC−VB_CIC−VC_CIC)/3). The estimated frequency from the zero crossings may then be calculated (block 30) using the time between zero crossings of the $V_{alpha}$ signal, as explained with respect to FIG. 2 above.

As shown in FIG. 1, the IED may obtain phasor measurements in a frequency determination technique (blocks 32, 34, 36, and 38) separate from the zero crossing frequency technique (blocks 28 and 30). The IED may generate (block 32) a phasor (magnitude and phase) of the input signal. Phasors of each phase (e.g., A-phase, B-phase, and C-phase) may be used to determine a positive sequence (block 34), negative sequence, or other transformation to obtain a phase angle suitable for frequency estimation. In the illustrated embodiment, the positive sequence phase angle may then be filtered via a first filter, such as an alpha-beta-gamma filter ($\alpha\beta\gamma$) (block 36), to obtain a phase angle, a first filtered frequency estimate from the first derivative (labeled Freq.Mag), and the second derivative of the phase angle with respect to time. The phase angle may be an estimated phase angle obtained from the measured phase angles, the first derivative, and the second derivative, such as those derived with equation 1.

As illustrated, the first frequency estimates may then be filtered via a second filter, such as an alpha-beta filter ($\alpha\beta$) (block 38), to obtain a second filtered frequency estimate and a second derivative of the phase angle with respect to time. The second filtered frequency estimates may provide a frequency estimate with relatively improved stability as compared to the first frequency estimate. The second filtered frequency estimates from the second filter may then be used as an input to generate the next phasor (block 32). The IED may store previous measurements from the $\alpha\beta\gamma$ and $\alpha\beta$ filters to be used with present measurements to reduce computations while improving stability of the frequency estimates. While $\alpha\beta\gamma$ and $\alpha\beta$ filters are used in the illustrated embodiment, Kalman filters or other filters may be used.

The alpha-beta-gamma filter may calculate the difference between the estimated angle at a time and the $V_{1angle}$ input. When the difference between the estimated angle at the time and the subsequently measured angle at that time is greater than a threshold, the IED may reset the internal rate of change of frequency values in the $\alpha\beta\gamma$ and $\alpha\beta$ filters to zero and hold the frequency values, which may lead to stabilizing the filters. When the difference is greater than the threshold for a period of time (e.g., 16 ms, 24 ms, 32 ms, etc.), the IED may determine that the rate of change of phase technique may be relatively inaccurate as compared to the zero-crossing technique, and the IED may reset the frequency estimates to the values obtained from the zero-crossing technique. After a cycle of using the frequency estimates obtained from the zero-crossings, the IED may resume using the frequency estimates from the rate of change of phase technique starting with a rate of change of frequency at zero. By controlling whether the IED estimates frequency based on an accuracy metric of the frequency, the IED may generate more reliable frequency estimates.

Figure 3:
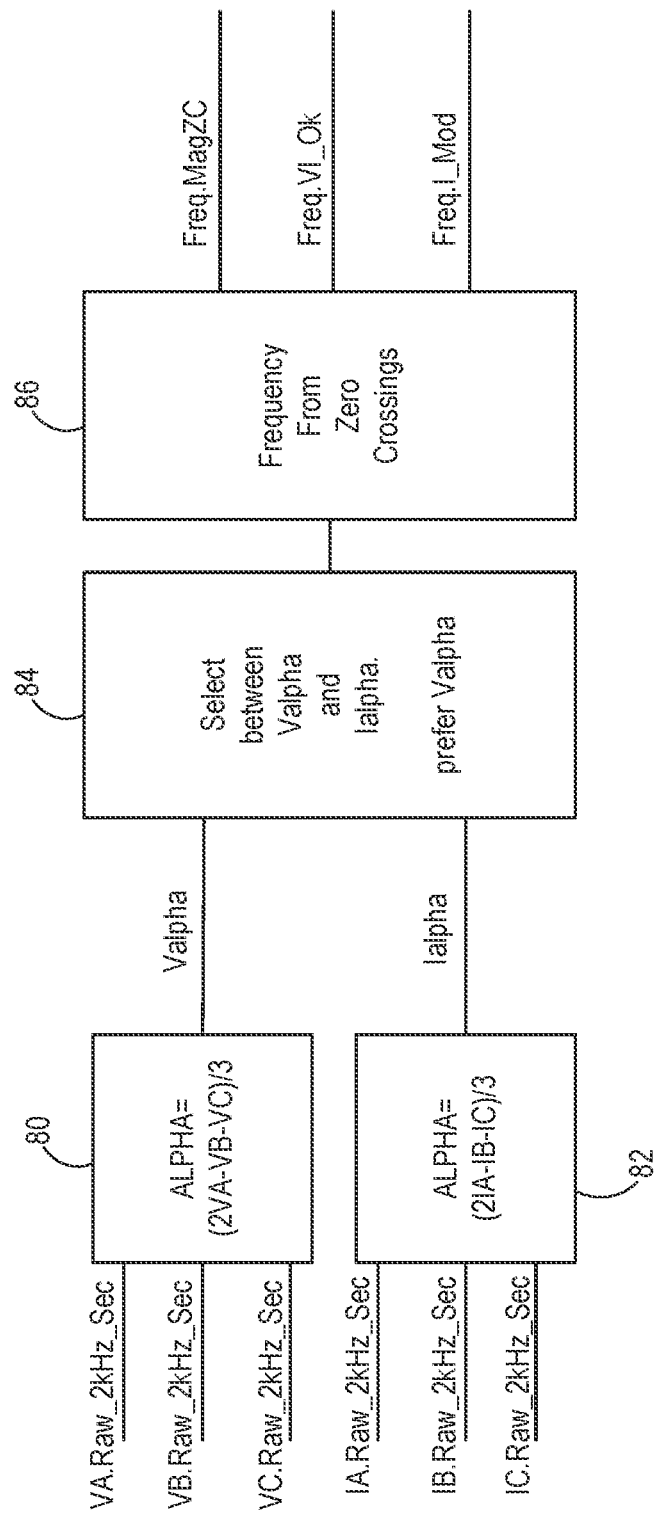
FIG. 3 is a data flow diagram of data used to obtain an operating frequency of the power system from zero crossings, in accordance with an embodiment.

FIG. 3 is a data flow diagram of data used to obtain an operating frequency of the power system from zero crossings, in accordance with an embodiment. Although $V_{alpha}$ is used as an example in blocks 28 and 30 of FIG. 1, the IED may select between input signals (at block 28). As illustrated, the IED may obtain a voltage measurements ($V_A$-$V_C$) and current measurements ($I_A$-$I_C$) of each phase in a set of phases of the power system. The IED may compute Valpha and Ialpha using the A, B, and C phase voltage measurements (block 80) and current measurements (block 82) at the output of the CIC filter. The IED may then select between $V_{alpha}$ and $I_{alpha}$ (block 84). Although the three phases are shown, as mentioned above, different implementations may use different input signals (e.g., single phase, transformer connected, etc.). The IED may estimate the operating frequency of the power system using the zero crossings from the electrical measurements of the selected signal.

Figure 4:
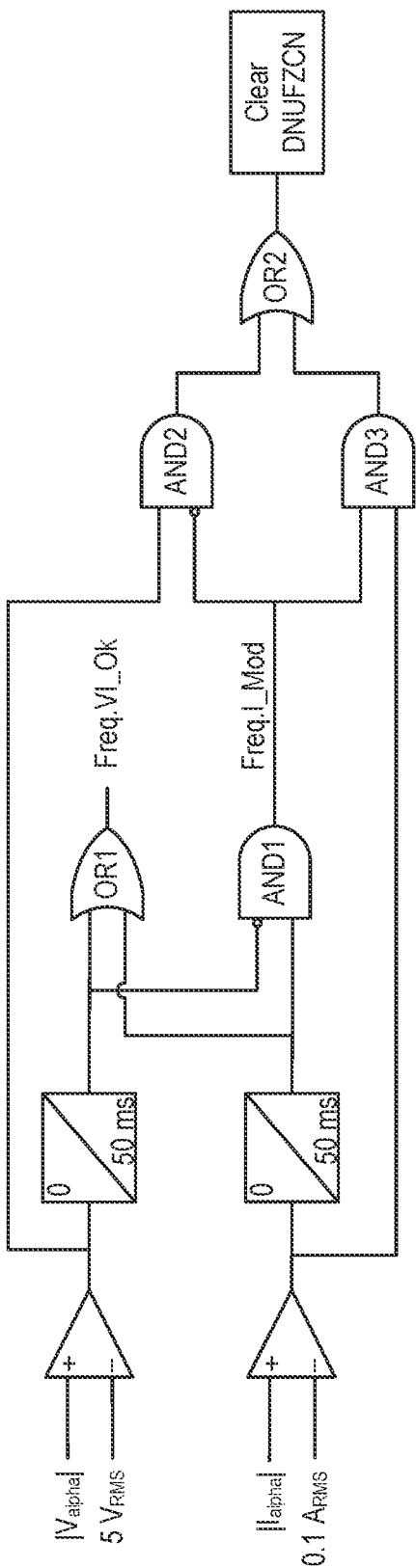
FIG. 4 is a logic diagram of the zero crossing frequency selection between voltage and current, in accordance with an embodiment.

FIG. 4 is a logic diagram of the zero crossing frequency selection between voltage and current. As illustrated, the relay computes the frequency from the zero crossings of $V_{alpha}$ when Freq.VI_Ok is high and Freq.I_Mod is low. The relay computes the frequency from the zero crossings of $I_{alpha}$ when Freq.VI_Ok is high and Freq.I_Mod is high. If Freq.VI_Ok is low, the relay may set the frequency from the zero crossings to be the nominal frequency. On the rising edge of Freq.VI_Ok, the relay may hold the frequency from the zero crossings until the sixth zero crossing of the input signal. After switching from $V_{alpha}$ to $I_{alpha}$ or from $I_{alpha}$ to $V_{alpha}$, the relay may hold the frequency from the zero crossings until the sixth zero crossing of the input signal. After a warm or cold start, the frequency from the zero crossings may be initialized as the nominal frequency and a do not use frequency zero crossings signal (DNUFZCN) may be set to 1 indicating that the rate of change of phase may be used.

Figure 5:
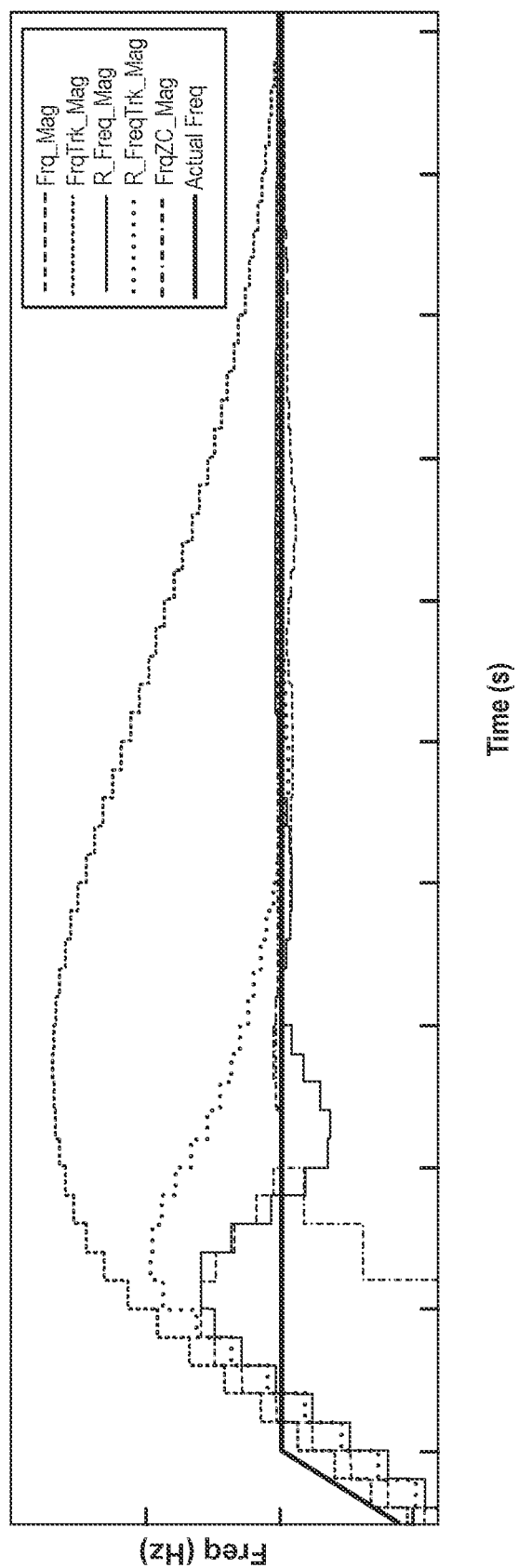
FIG. 5 is a plot of estimated frequencies from the process of FIG. 1 at the end of a frequency ramp up where an overshoot in estimated frequencies may occur, in accordance with an embodiment.

FIG. 5 is a plot of an actual frequency in a power system and different frequency measurements obtained using the various frequency techniques described above. The second filtered frequency (Freqtrk.Mag), lags the first filtered frequency (Freq.Mag), under normal operation, including steady state, slow frequency ramps, and small frequency jumps. The lag between Freqtrk.Mag and Freq.Mag makes Freqtrk.Mag more stable and better suited for phasor generation. When the rate of change of frequency (ROCOF) decreases in absolute value, Freqtrk.Mag may overshoot the first filtered signal, the frequency from the zero crossings (Freq.MagZC), and the actual frequency.

As illustrated, the actual frequency increases to 60 Hz causing an overshoot of the second filtered frequency (Frqtrk_Mag) as compared to Freq.Mag, Freq.MagZC, and the actual frequency. To limit the overshoot, the IED may scale down the ROCOF when:

Freqtrk.Mag>Freq.Mag AND
Freqtrk.Mag>Freq.MagZC AND ROCOF>0

The IED may also scale down ROCOF if the converse is true:

Freqtrk.Mag<Freq.Mag AND
Freqtrk.Mag<Freq.MagZC AND ROCOF<0

Further, to limit activation on slow ramps, the FED may include preset thresholds to the frequency comparators:

Freqtrk.Mag>Freq.Mag+TH1 AND
Freqtrk.Mag>Freq.MagZC+TH1 AND
ROCOF>0

Freqtrk.Mag<Freq.Mag+TH1 AND
Freqtrk.Mag<Freq.MagZC+TH1 AND
ROCOF<0 where TH1 is the preset threshold. By limiting the ROCOF, the IED may generate a more accurate frequency during frequency ramps while also being more stable than using the first filtered frequency. To calculate the estimated frequency, some relays may use fixed point math with a fixed precision that may cause oscillations in the estimated frequency due to rounding in the fixed point calculations.

Figure 6:
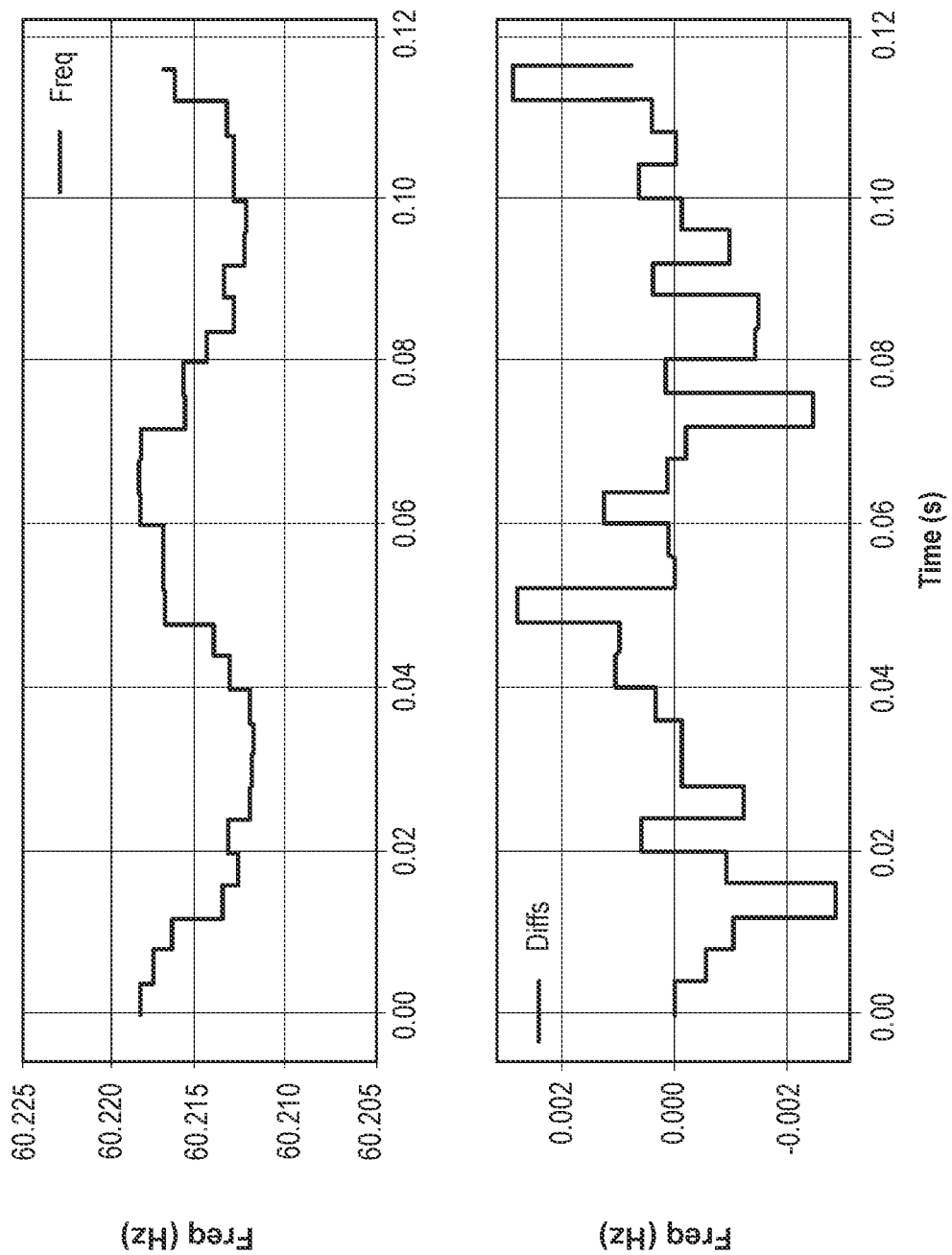
FIG. 6 is a plot of rounding error oscillations from fixed point arithmetic being used in the process of FIG. 1, in accordance with an embodiment

FIG. 6 is a plot of the rounding error oscillations that may be detected by the IED. To detect the oscillations, the IED may create a buffer with a set of the most recent frequency differences over a window of time. The IED may obtain difference values between each frequency measurement over the time window. The IED may compute an absolute value of the sum of the differences (ABSDIFF) ($|\Sigma\Delta f|$) between each measured frequency of a window and the sum of the absolute value of the differences (SUMABS) ($\Sigma|\Delta f|$) between each measured frequency of the window. A small SUMABS indicates that the frequency differences in the window do not include substantial oscillation, nor is the frequency changing in the window.

A small ABSDIFF value indicates that, overall, the frequency did not change substantially in the window. Conversely, a large ABSDIFF value indicates that the frequency is changing with a defined trend. If the ABSDIFF value is smaller than a threshold and SUMABS is larger than a threshold, the IED may determine that there are oscillations in the signal and set the value of Freq.Mag to the value of Freqtrk.Mag. While SUMABS and ABSDIFF are used as examples, other suitable calculations, such as sign changes of the differences, may be used to detect oscillations.

Figure 7:
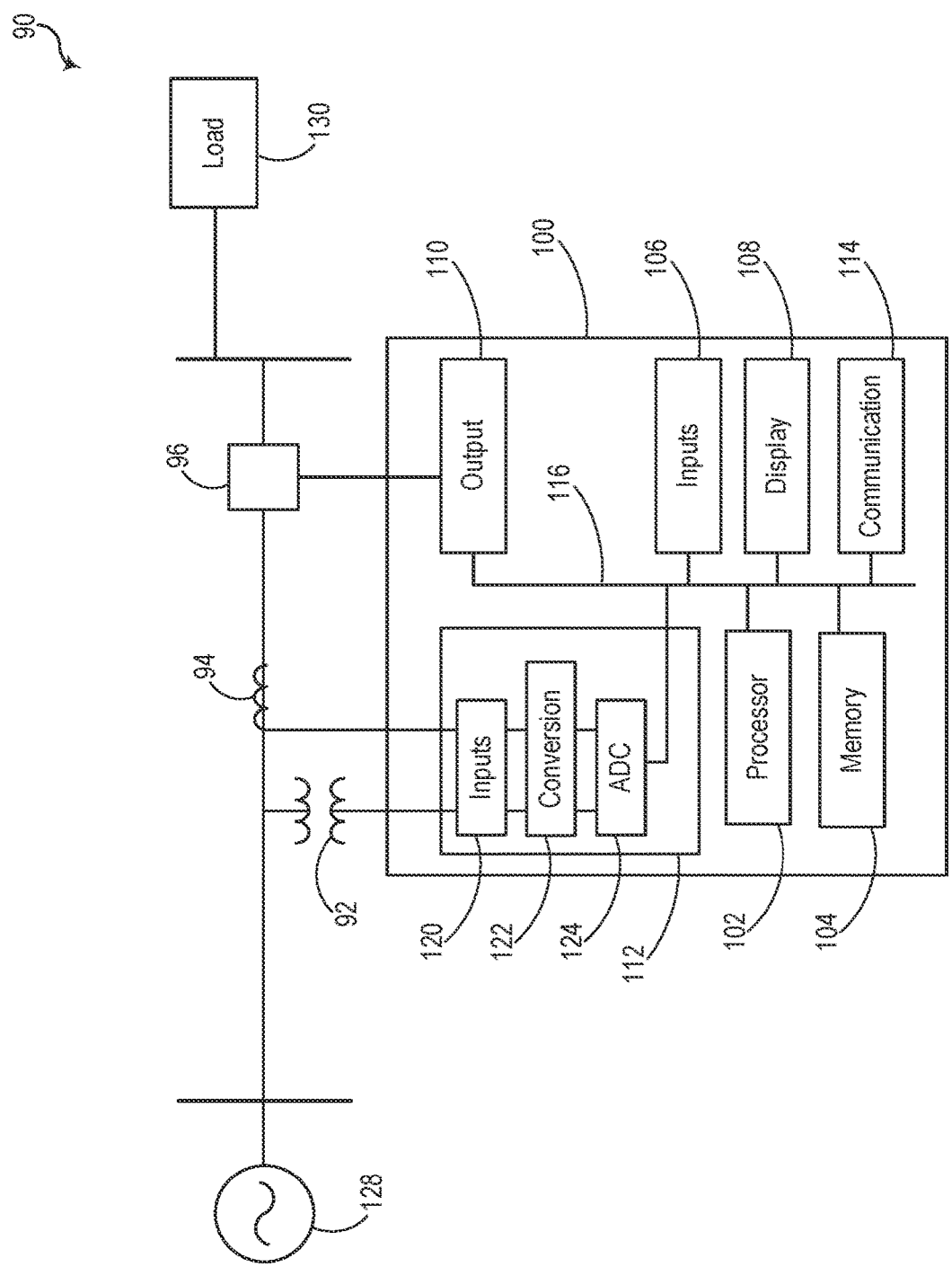
FIG. 7 is a block diagram of the IED that may be used to estimate the operating frequency of the power system, in accordance with an embodiment.

FIG. 7 is a block diagram of an IED 100 in a power system 90 that estimates frequency using electrical conditions of the power system 90. The power system 90 includes one or more power sources 128, such as generators, electrically connected to one or more loads 130. The IED 100 may monitor the electrical conditions of the power line between the power sources 128 and the loads 130. As used herein, an IED (such as IED 100) may refer to any microprocessor-based device that mom tors, controls, automates, and/or protects monitored equipment within the power system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, digital sample publishing units, merging units, and the like. The term IED may be used to describe an individual IED or a system comprising multiple IEDs.

The power system 90 includes potential transformer(s) (PT(s)) 92, current transformer(s) (CTs) 94, and circuit breaker(s) (CBs) 96. The IED may be communicatively coupled to potential transformer(s) 92 and/or current transformer(s) 94 to receive signal(s) indicating voltage measurements and/or current measurements of the power line. Further, the IED 100 may be communicatively coupled to the CB 96 to send signal(s) to the CB 96 to electrically connect or disconnect electrical equipment from the remaining power system.

In the illustrated embodiment, the IED 100 includes a processor 102, a computer-readable storage medium 104, input structures 106, a display 108, output circuitry 110, sensor circuitry 112, and communication circuitry 114. The IED may include one or more bus(es) 116 connecting the processor 102 or processing unit(s) to the computer-readable storage medium 104, the input structures 106, the display 108, the output circuitry 110, the sensor circuitry 112, and/or the communication circuitry 114. The computer-rea.dable storage medium 104 be embodied as memory, such as random access memory (RAM), read only memory (ROM), or a combination thereof, and may include or interface with software, hardware, or firmware modules for implementing various portions of the systems and methods described herein. The computer-readable storage medium 104 may be the repository of executable instructions configured to implement any of the processes described above with respect to FIGS. 1-6. In some embodiments, the processes described above may be performed in hardware, firmware, or a combination of both.

The processor 102 may process inputs received via the sensor circuitry 112 and the communication circuitry 114. The processor 102 may operate using any number of processing rates and architectures. The processor 102 may be configured to perform various algorithms and calculations described herein using computer executable instructions stored on computer-readable storage medium 104. The processor 102 may be embodied as a microprocessor. In certain embodiments, the processor 102 and/or the computer-readable storage medium 104 may be embodied as discrete electrical components, a general purpose integrated circuit, one or more Application Specific Integrated Circuits ("ASICs"), a Field Programmable Gate Array ("FPGA"), and/or other programmable logic devices. The processor 102 and/or the computer-readable storage medium 104 may be referred to generally as processing circuitry.

As illustrated, the sensor circuitry 112 may include, for example, input pins 120 or connectors that receive voltage signal(s) from voltage sensors, such as the PT 92 and current signals(s) from current sensors, such as the CT 94. The sensor circuitry 112 may transform the current and voltage signals using conversion circuitry 122 to a level that may be measured (e.g., via internal transformers), and sample the signals using, for example, A/D converter(s) 124 to produce digital signals representative of measured voltage and measured current on the power line. The A/D converter 124 may be connected to the processor 102 by way of the bus 116, through which digitized representations of voltage signals may be transmitted to the processor 102. The processor 102 may use the voltage measurements and current measurements to perform control operations to control the CB 96.

The communication circuitry 114 may include communication ports, such as ethernet and serial ports. The IED 100 may include a display screen 108 that displays information to notify an operator of operating parameters of the electric power delivery system 90, such as current measurements, voltage measurements, frequency estimates, power flow direction, etc. The input structures 106 may include buttons, controls, universal serial bus (USB) ports, or the like, to allow a user to provide input settings (e.g., threshold settings). In some embodiments, the display 108 may be a touchscreen display.

The output circuitry 110 may include one or more output pins or connectors that electrically connect the IED 100 to the CB 96 to allow the 100 to send control signals to the to control connection or disconnection of the loads 130. While a single phase is shown in FIG. 7, note that this is simply meant to be illustrative and any suitable number of phases (e.g., three phases) may be monitored and/or protected.

The IED 100 may receive the voltage measurements and/or current measurements and estimate the frequency of the power system 90. The IED 100 may shed loads 130 based upon the estimated frequency. For example, the IED 100 may detect that the frequency has decreased below a threshold frequency and disconnect the loads 130 by tripping the CB 96.

In some embodiments, the IED 100 may shed loads based on the estimated frequency. In other embodiments, the IED 100 may communicate the frequency measurements to a central monitoring system via the communication circuitry 114 to allow the central monitoring system to perform control actions on the power system 90, such as increasing generation of the power system.

By obtaining a more accurate and reliable estimated frequency using multiple techniques to estimate the frequency (e.g., from zero crossings and estimated frequency from rate of change of phase), the IED 100 may shed loads 130 faster, more reliably, and more accurately when it is desired to do so as compared to using a single technique. Further, by shedding loads faster with the improved estimated frequency, reliability of the power system may be improved by reducing the amounts of loads shed involved in balancing the power generation with the power consumed.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

The invention claimed is:

1. A method, comprising:
receiving, via an intelligent electronic device (JED), electrical measurements of an input signal of a power system; and
determining, via the IED, an estimated frequency of the power system using a rate of change of phase of the power system and using zero crossings of the power system, wherein selection between using the rate of change of phase and using the zero crossings is based on a comparison between an estimated phase angle and a measured phase angle of the power system.

2. The method of claim 1, comprising filtering the input signal to obtain a first filtered frequency.

3. The method of claim 2, complising filtering the first filtered frequency to obtain a second filtered frequency.

4. The method of claim 3, comprising scaling down a rate of change of frequency (ROCOF) when the second filtered frequency is greater than the first filtered frequency, the second filtered frequency is greater than the estimated frequency from the zero crossings, and the ROCOF is greater than zero.

5. The method of claim 3, comprising scaling down a rate of change of frequency (ROCOF) when the second filtered frequency is less than the first filtered frequency, the second filtered frequency is less than the estimated frequency from the zero crossings, and the ROCOF is less than zero.

6. The method of claim 3, wherein the second filtered frequency is used in phasor generation of a subsequent phasor used in determining a subsequent rate of change of phase.

7. The method of claim 1, comprising detecting rounding error oscillations based on an absolute value of a sum of differences (ABSDIFF) between frequency measurements of the input signal in a window of time and a sum of an absolute value of differences (SLJMABS) between frequency measurements in the window of time.

8. The method of claim 1, comprising sending a trip signal to trip a circuit breaker based upon the estimated frequency.

9. An intelligent electronic device (IED), comprising:
input circuitry configured to receive an input signal indicating an electrical characteristic of a power system; and
processing circuitry configured to:
determine an estimated accuracy of a rate of change of phase by comparing an estimated phase angle of the power system with a measured phase angle; and
selecting an estimated frequency of the power system from among a first estimated frequency determined from the rate of change of phase of the power system and a second estimated frequency determined from zero crossings of the power system, wherein the selection between the first estimated frequency and the second estimated frequency is based on the estimated accuracy.

10. The JED of claim 9, wherein the processing circuitry is configured to send a signal to a circuit breaker to shed load of the power system based at least in part on the estimated frequency.

11. The IED of claim 9, wherein the processing circuitry is configured to select either voltage measurements or current measurements to be used as the electrical characteristic.

12. The IED of claim 9, wherein the processing circuitry is configured to filter the input signal to obtain a first filtered frequency, and to filter the first filtered frequency to obtain a second filtered frequency, wherein the processing circuitry is configured to scale down a rate of change of frequency (ROCOF) when the second filtered frequency is greater than the first filtered frequency, the second filtered frequency is greater than the second estimated frequency from the zero crossings, and the ROCOF is greater than zero.

13. The IED of claim 9, wherein the processing circuitry is configured to detect rounding error oscillations based on an absolute value of a sum of differences (ABSDIFF) between frequency measurements of the input signal in a window of time and a sum of an absolute value of differences (SUMABS) between each frequency measurements of the input signal in the window of time.

14. The IED of claim 9, wherein the processing circuitry is configured to select the estimated frequency as the second estimated frequency when the estimated accuracy of the rate of change of phase decreases below a threshold for a predetermined period of time.

15. The IED of claim 9, wherein the processing circuitry is configured to:
   perform a first transformation on the input signal for obtaining the second estimated frequency from zero crossings; and
   perform a second transformation on the input signal for obtaining the first estimated frequency from the rate of change of phase.

16. The IED of claim 15, wherein the first transformation is used to obtain V alpha and the second transformation is used to obtain a positive sequence of the electrical characteristic.

17. The IED of claim 9, wherein the processing circuitry is configured to set a rate of change of frequency (ROCOF) of the input signal to zero and maintain the present frequency as the estimated frequency when the estimated accuracy exceeds a threshold.

18. A non-transitory, computer readable medium comprising instructions that, when executed by processing circuitry, are configured to cause the processing circuitry to perform operations comprising:
   obtaining electrical measurements of an input signal of a power system;
   determining a first estimated frequency of the power system using a rate of change of phase; and
   determining a second estimated frequency of the power system using zero crossings;
   wherein selection of the first estimated frequency and the second estimated frequency is based at least in part on an estimated accuracy of the rate of change of phase.

19. The non-transitory, computer readable medium of claim 18, wherein the instructions, when executed by the processing circuitry, are configured to perform operations comprising selecting the first estimated frequency when the estimated accuracy of the rate of change of phase is greater than a threshold.

20. The non-transitory, computer readable medium of claim 18, wherein the instructions, when executed by the processing circuitry, are configured to perform operations comprising sending a signal to a circuit breaker to shed load of the power system based at least in part on an estimated frequency.

* * * * *